United States Patent [19]

Strumban et al.

[11] Patent Number: 5,593,740
[45] Date of Patent: Jan. 14, 1997

[54] METHOD AND APPARATUS FOR MAKING CARBON-ENCAPSULATED ULTRAFINE METAL PARTICLES

[75] Inventors: Emil E. Strumban, Oak Park, Mich.; Edward K. Dobrinsky, Saratoy, Russian Federation; Anatoly A. Kuznetsov; Avetik H. Harutyunyan, both of Moscow, Russian Federation

[73] Assignee: Synmatix Corporation, Farmington Hills, Mich.

[21] Appl. No.: 373,631

[22] Filed: Jan. 17, 1995

[51] Int. Cl.$^6$ .................................................. H05H 1/24
[52] U.S. Cl. .................. 427/577; 118/716; 118/719; 118/723 ER; 118/724; 427/216; 427/245; 427/255.1; 427/580; 427/585
[58] Field of Search .................................. 427/577, 580, 427/585, 216, 245, 255.1; 118/716, 719, 723 ER, 724

[56] References Cited

U.S. PATENT DOCUMENTS

| | | |
|---|---|---|
| 3,994,697 | 11/1976 | Burke ........................... 44/51 |
| 4,274,874 | 6/1981 | Obara et al. ..................... 75/231 |
| 5,302,450 | 4/1994 | Rao et al. ........................ 428/357 |

OTHER PUBLICATIONS

"Single Crystal Metals Encapsulated in Carbon Nanoparticles", Science, vol. 259, Jan. 15, 1993, pp. 346–348.
"Cobalt-catalysed growth of carbon nanotubes with single-atomic-layer walls", Nature, vol. 363, Jun. 17, 1993.

*Primary Examiner*—Bernard Pianalto
*Attorney, Agent, or Firm*—Harness, Dickey & Pierce, P.L.C.

[57] ABSTRACT

A method and apparatus for making carbon-encapsulated ultrafine metal particles, in which metal powder intended for encapsulation is injected at a rate up to 25 grams per minutes into a plasma arc so that the metal powder is vaporized. The vaporized metal powder is then mixed with an active gas flow, which consists of hydrocarbons, filled in the surrounding area of the plasma arc, and thereby the vaporized metal powder and the active gas interact continuously producing carbon encapsulated ultrafine metal particles that are remarkably predictable in particle size, distribution of sizes and atomic composition.

16 Claims, 1 Drawing Sheet

METHOD AND APPARATUS FOR MAKING CARBON-ENCAPSULATED ULTRAFINE METAL PARTICLES

BACKGROUND OF THE INVENTION

This invention relates to a method for making carbon-encapsulated ultrafine metal particles by the application of plasma assisted evaporation.

There has been a need, so far unresolved, for a method for making carbon-encapsulated ultrafine metal particles. Such materials, with a particle diameter less than 1000 Angstroms, exhibit properties which make them valuable for many applications, including utilization of a wide range of air-sensitive metals, formation of catalysts with enhanced activities at relatively low temperatures, and making of solid lubricants pigments and toners. Accordingly, the mass-production of carbon-encapsulated ultrafine metal particles at low cost is widely desired.

The high temperature catalytic reduction of carbon monoxide on the surface of iron particles is a well-known method for making ultrafine carbon-coated iron particles. This technique however, is not suitable for mass production because the formation rate of the particles is slow and the production rate of the particles is low.

The most successful among the known methods for making carbon-encapsulated ultrafine metal particles with an improved formation rate is the high current carbon arc evaporation process.

In the article entitled, *"Single Metals Encapsulated in Carbon Nanoparticles"*, Science, Vol. 259, 15 Jan. 1993, (Rodney S. Ruoff, Donald C. Lorents, Bryan Chan, Ripudaman Maltotra, Shekhar Subramoney) there is disclosed a technique for making carbon-encapsulated ultrafine metal particles of $\alpha$-$LaC_2$ by this process.

Similar technological method has been disclosed in *"Cobalt Catalyzed Growth with Single Atomic Layer Walls"*, Nature, Vol 363, 17 Jun. 1993, (D. S. Bethune, C. H. Kiang, M. S. de Vries, G. Gorman, R. Savoy, J. Vazques and R. Beyers) for producing graphite-encapsulated nanocrystals of magnetic materials (Fe, Ni or Co). It is this technique in which metal powder is packed within a recess that is drilled in the positive graphite electrode. The arc conditions included a D.C. current of 150A, a gap distance of about 1 mm between negative electrode and translating positive electrode, and He pressure of 500 torr. This technique utilizes plasma as a vaporization heater and it is more productive than the high temperature carbon monoxide catalytic reduction method. However this technique still produces a relatively small quantity of product because while all the metal powder is vaporized only a small amount which fits in the cathode cavity can produce product at one time. Thus, it is difficult to employ this technique on a profitable basis.

Therefore, it has been a goal in the art to produce a higher yield, commercially viable process of producing carbon encapsulated ultrafine particles.

SUMMARY OF THE INVENTION

Accordingly, it is the primary object of the present invention to provide a method for producing carbon-encapsulated metal particles, which overcomes the above mentioned disadvantages.

It is a further object of the present invention to provide a method for efficiently making carbon-encapsulated metal particles.

It is a still further object of the present invention to provide a method for continuously making carbon-encapsulated ultrafine metal particles.

It is another object of the present invention to provide a method for making carbon-encapsulated ultrafine metal particles at a low cost.

In accordance with these goals and objectives in the present invention there is provided a process for producing carbon encapsulated ultrafine metal particles. The process includes the steps of first forming a plasma arc. A powdered metal material is then caused to contact the plasma arc for vaporizing the metals. The vaporized metal is then mixed with a carbon containing gas. This mixture is then quenched at a rate of from about $10^{2o}$ k./sec to about $10^{6o}$ k./sec which forms ultrafine carbon encapsulated particle product. By use of this process ultrafine carbon encapsulated particles can be continuously produced.

An advantage of this invention is that the carbon-encapsulated ultrafine metal particles can be produced at a low cost due to using efficient joule-heating which eliminates heat loss.

Another advantage of this invention is that homogeneous carbon-encapsulated ultrafine metal particles can be produced continuously with high efficiency due to an essentially lengthened conducting plasma column that is aero-dynamically stabilized along the reaction chamber axis.

Further objects and advantages will be appreciated upon review of the brief description of the figures, detailed description of the preferred embodiments and the claims appended hereto, wherein all percentages are by weight unless otherwise specified.

BRIEF DESCRIPTION OF THE FIGURES

The FIGURE is a cross-sectional schematic view of an apparatus for carrying out the process of the present invention.

DETAILED DESCRIPTION OF THE PREFERRED EMBODIMENTS

Figure 1:
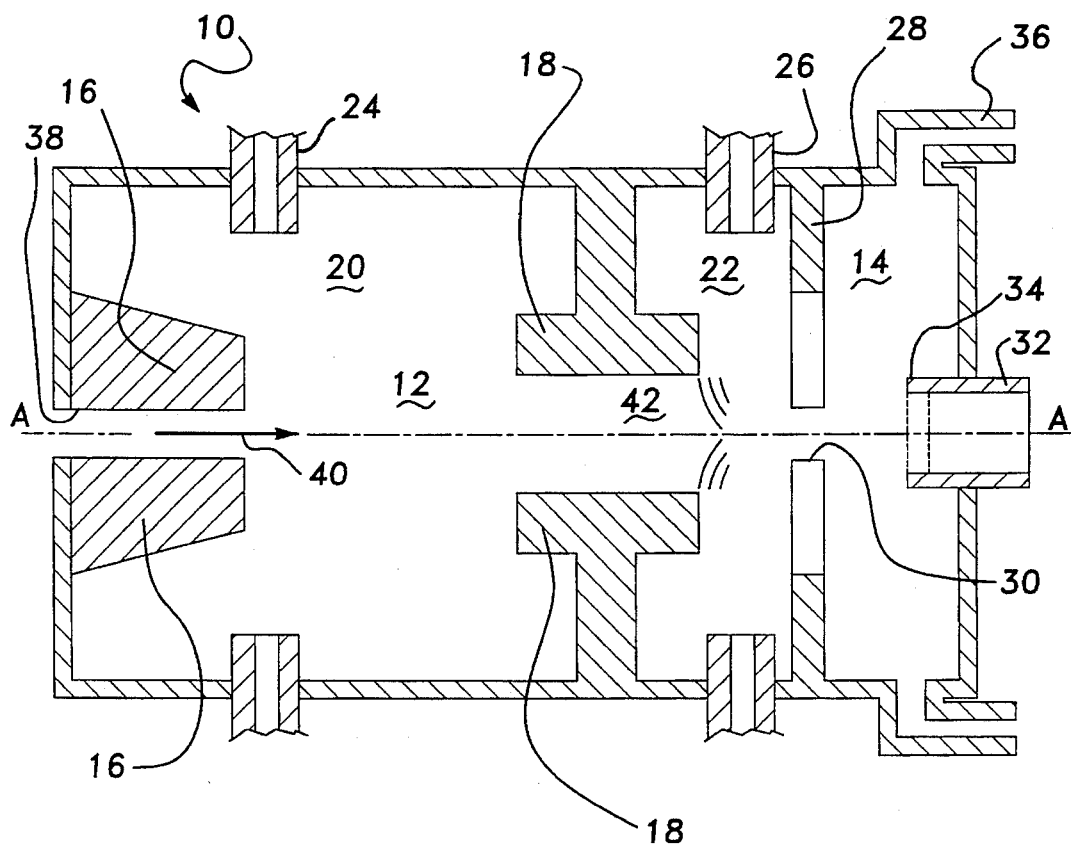

In accordance with broad process aspects of the present invention, a process for producing a carbon-encapsulated ultrafine metal particle material includes the steps of:

a) forming a plasma arc:

b) causing a powdered metal material to contact the plasma arc for vaporizing the metal and thereafter mixing the vaporized metal with a source of carbon containing substance and c) quenching the product of step B at a rate of from about $10^{2o}$ k./sec to about $10^{6o}$ k./sec for forming carbon-encapsulating ultrafine metal particle material product and d) collecting the product.

Referring now to FIG. 1 there is shown an apparatus 10 which maybe utilized for accomplishing the process steps set forth above. The apparatus 10 is an enclosed reaction chamber device configured about a centered axis A—A. Apparatus 10 includes a first reaction chamber 12 and second quenching chamber 14. The reaction chamber 12 includes a cathode 16 and an anode 18. The anode 18 is preferably a "washer type" cylindrical member which separates the chamber 12 into a first chamber 20 and second chamber 22. An inlet tube 24 is provided for injecting an inert gas into chamber 20 under which atmosphere the arc is formed between cathode 16 and anode 18, and for creating a pronounced radial density gradient in the chamber, causing the arc to remain along the central line of the chamber 18. A separate injection tube 26 is provided in chamber 22 for injecting a carbon containing gas into the chamber 22. Chamber 22 is separated from third chamber 14 via a wall 28. Wall 28 includes a regulating orifice 30 therein. An inlet 32 is provided for injection of a quenching gas into chamber 14. Inlet 32 includes a cover 34 for improved distribution of the quenching gas through Inlet 32. A collection outlet tube 36 is also provided for collection of the product out of chamber 14.

The cathode 16 is preferably made from a tungsten material and includes a central orifice 38. Orifice 38 allows for injection of a metal powder material to be vaporized into the chamber 12 as shown by arrow 40. Thus, in accordance with the first step of the present invention a plasma arc is formed between the cathode 16 and the anode 18. The space between the cathode and anode is preferably from an effective distance of greater than 0 to about 300 mm with a preferred distance being from about 150 mm to about 300 mm. This is accomplished as is known to those skilled in the art. Typical currents required for forming the arc between anode 18 and cathode 16 is from about 100 to about 200 amps. In the preferred embodiment the anode is made of a steel material. The plasma arc is preferably formed in the first chamber 20 in an inert atmosphere. An inert gas such as nitrogen, argon or the like is injected through the injection tube 24 to fill the chamber 20. As will be readily appreciated by those skilled in the art the voltage and currents will vary depending on the conditions in the chamber. Upon formation of the plasma arc a plasma jet is formed in the space 42 above the hollow anode 18 in a direction along axis A—A. The principles by which such plasma jets are formed are well known in the art. Thereafter, a metal powder is injected through the orifice 38 along arrow 40, while the plasma arc between cathode 16 and anode 18 is energized. The metal powder may be injected by way of a suitable inert gaseous carrier stream utilizing nitrogen or the like to allow a continual fluid stream of metal particles to be injected into the plasma arc formed between the cathode 16 and the anode 18. While it is possible to vaporize any type of metal powder preferred metal powders include iron, cobalt, nickel, copper, aluminum, silicone and their alloys and mixtures thereof. While not entirely critical it is preferred that the size of the metal powder particles is less than about 100 microns preferably the particle sizes is from about 50 microns to about 100 microns. The process allows through-put of metal powder at a rate of up to about 25 g/min with typical rates being from about 10 to about 25 g/min, with preferred injection rates being from about 20 to about 25 g/min. Upon entering the plasma arc area the metal powder is immediately vaporized and proceeds along the flow of the plasma jet created by the arc formation into the area 42.

The inlet 26 is utilized to force a carbon containing material into the chamber 22. Preferred carbon containing materials are gases such as methane, ethane, propane, ethylene, or other gases which provide free carbon in chamber 22. However, other materials which readily release free carbon during evaporation may be utilized since upon entry into the chamber the temperatures therein, due to the plasma arc, will immediately vaporize virtually any carbon containing material. Thus as the metal powder proceeds into the chamber area 22 the metal vapor is intermixed with free carbon.

The metal vapor and carbon vapor are thereafter quenched by utilization of a cooling stream through cooling aperture 32 which is directed in an opposite direction to the plasma jet and through the orifice 30. While not wishing to be bound by theory, it is believed that the metal vapor upon being quenched very rapidly solidifies forming an ultrafine particle nucleation, upon which the carbon can precipitate onto the surface. This forms the ultrafine particle which is encapsulated by carbon. Generally, the cooling rate required is a rate of from about $10^{2°}$ K./sec to about $10^{6°}$ K./sec with preferred rates of quenching being from about $10^{4°}$ K./sec to about $10^{6°}$ K./sec this quenching step forms microfine particles which are encapsulated in carbon. In a preferred embodiment the orifice 30 is a variable orifice such that the through-put of the vapor and carbon mixture into the chamber 14 maybe adjusted to optimum conditions. The inlet tube 32 preferably includes a cover 34 which includes a series of radial slots therein for distribution of the cooling gas to provide the proper cooling and solidification of the metal vapor and carbon encapsulated particles.

Thereafter a suction is utilized for removing material through tube 36.

Further understanding the present invention will be had with reference to the following example which is set forth herein for purposes of illustration but not limitation.

EXAMPLE I

An apparatus for making carbon-encapsulated ultrafine metal particles, as composed above, was employed in producing carbon-encapsulated iron particles.

First, the reaction chamber 10 was filled with nitrogen gas that was injected at 50 liters/min through inlet 24 into the chamber 20. An electric current of approximately 130V, 150A was conducted between tungsten cathode 2 and steel anode 3 to generate plasma with the length of conductive column, being about 300 millimeters. The stabilizing nitrogen gas was injected at 300 liters/min, through the inlet 26 into evaporation chamber 20 of the reaction chamber 10. Then, iron powder with an average diameter of 50 microns was injected into the chamber 20 through the hallow cathode 16 by means of a nitrogen carrier gas. The nitrogen carrier gas was injected at 30 liters/min and the iron powder was injected at 20 g/min. The propane active gas was injected through pipe 26 into reaction chamber 10 at 40 liters/min and mixed with vaporized metal powder in the plasma jet area between the anode 18 and regulating orifice 30. During the process of mixing active gas and vaporized metal, powder interact forming carbon-encapsulated iron vapor species, due to excess of free carbon in plasma.

Then this vapor species flows to the quenching chamber 14 through regulating diaphragm 30. In the quenching chamber 14 the plasma stream is rapidly cooled by means of nitrogen gas stream 14 injected at 130 liters/min. through pipe 32 having a filter in the direction opposite to plasma stream flow. This high rate quenching process leads to formation of carbon-encapsulated ultrafine iron particles, but simultaneously inhibits further particle size growth. The carbon-encapsulated ultrafine iron particles made went through a bag filter (not shown) and later extracted.

As a result of this production method, carbon-encapsulated ultrafine iron particles with an average diameter of 500 angstrom were obtained. The production rate was about 20 g/min. which is approximately 100 times faster than conventional techniques for making carbon-encapsulated ultrafine particles.

It will be readily appreciated by those skilled in the art that the present invention can be practiced other than as specifically stated. Thus, the invention may be subject to modification, variation and change without departing from the proper scope and fair meaning of the accompanying claims.

What is claimed:

1. A process for producing carbon encapsulated ultrafine metal particles comprising:
   a) forming a plasma arc;
   b) causing a powdered metal material to contact the plasma arc for vaporizing the metal and thereafter mixing the vaporized metal with a source of a carbon containing gas;
   c) quenching of the product of step b) at a rate of from about $10^2$ K./sec to about $10^6$ K./sec, for forming the carbon encapsulated ultrafine metal material product; and;
   d) collecting the product of step c).

2. The process of claim 1 wherein said powdered metal material is selected from the group consisting of iron, cobalt, nickel, copper, aluminum, silicon and mixtures thereof.

3. The process of claim 1 wherein said source of a carbon containing gas is selected from the group consisting of: benzene, methanol, ethanol, methane, ethane, propane, ethylene, benzene and mixtures thereof.

4. The process of claim 1 wherein said powdered metal material is caused to contact said plasma arc in a continuous manner.

5. The process of claim 4 wherein a gaseous carrier stream injects said powdered metal material for causing the powdered metal material to contact the plasma arc in a continuous manner.

6. The process of claim 5 wherein step C is accomplished by injection of a cooling gaseous stream into the product of step b).

7. The process of claim 6 wherein said carrier gaseous stream is injected in a direction opposite to a direction of a plasma jet created by said plasma arc.

8. The process of claim 6 wherein said cooling gaseous stream is an inert gas.

9. The process of claim 4 wherein the powdered metal material is introduced into the plasma are at a rate of 25 grams per minute or less.

10. The process of claim 1 wherein said carbon containing gas is a mixture of a carbon containing gas and an inert gas.

11. An apparatus for producing carbon encapsulated ultrafine metal particles comprising:
    a first chamber;
    a second chamber;
    and a third chamber;
    said first chamber having an inert atmosphere and including a cathode and an anode for forming a plasma arc between said cathode and said anode; said anode forming a passage into said second chamber and configured for forming a plasma jet in said second chamber;
    an injection device, for introducing a powdered metal material into said plasma arc for vaporizing of the powdered metal material;
    an injection device for introducing a carbon-containing material into said second chamber;
    a device for cooling and precipitating carbon encapsulated material in said third chamber.

12. The apparatus of claim 11 wherein there is provided a passage way between said second and third chamber which includes a regulating orifice which is adaptable for adjusting throughput into said third chamber.

13. The apparatus of claim 12 wherein said regulating orifice is aligned with a cooling stream for regulating the quenching rate.

14. The apparatus of claim 13 wherein the said device for cooling in said third chamber is a gaseous stream being injected into said third chamber.

15. The apparatus of claim 14 wherein said gaseous stream is injected into said third chamber in a direction opposite the direction of said plasma jet.

16. The apparatus of claim 11 wherein said injection device for introducing the carbon containing material is an inlet into said second chamber.

* * * * *

UNITED STATES PATENT AND TRADEMARK OFFICE
CERTIFICATE OF CORRECTION

PATENT NO. : 5,593,740

DATED : January 14, 1997

INVENTOR(S) : Emil E. Strumban, et al.

It is certified that error appears in the above-indentified patent and that said Letters Patent is hereby corrected as shown below:

Front Page, [57] ABSTRACT, Line 10, "carbon encapsulated" should be --carbon-encapsulated--.

Column 2, Line 17, "k./sec" should be --K./sec--, both occurrences.

Column 2, Line 32, "figures," should be --figure,--.

Column 2, Line 38, "FIGURES" should be --FIGURE--.

Column 2, Line 49, "arc:" should be --arc;--.

Column 2, Line 53, "substance and" should be --substance;--.

Column 2, Line 54, "step B" should be --step b)--.

Column 2, Line 57, "product and" should be --product; and--.

Column 3, Line 12, "Inlet" should be --inlet--.

Column 4, Line 12, "K./sec this" should be --K./sec. This--.

Column 4, Line 20, "carbon encapsulated" should be --carbon-encapsulated--.

Column 4, Line 49, after "mixing" insert --, the--.

Column 4, Line 49, "metal," should be --metal--.

Column 4, Line 53, "diaphragm" should be --orifice--.

Column 5, Line 17, Claim 1, "$10^2$ K./sec" should be --$10^{2o}$ K./sec--.

UNITED STATES PATENT AND TRADEMARK OFFICE
CERTIFICATE OF CORRECTION

PATENT NO. : 5,593,740

DATED : January 14, 1997

INVENTOR(S) : Emil E. Strumban, et al.

It is certified that error appears in the above-indentified patent and that said Letters Patent is hereby corrected as shown below:

Column 5, Line 18, Claim 1, "carbon encapsulated" should be --carbon-encapsulated--.

Column 5, Line 19, Claim 1, "and;" should be --and--.

Column 5, Line 35, Claim 6, "step C" should be --step c)--.

Column 6, Line 2, Claim 9, delete "are".

Column 6, Line 6, Claim 11, "carbon encapsulated" should be --carbon-encapsulated--.

Column 6, Line 23, Claim 11, "carbon encapsulated" should be --carbon-encapsulated--.

Column 6, Line 28, Claim 12, "throughput" should be --through-put--.

Signed and Sealed this

Thirteenth Day of May, 1997

*Attest:*

BRUCE LEHMAN

*Attesting Officer*  *Commissioner of Patents and Trademarks*